(12) United States Patent
Wu et al.

(10) Patent No.: US 12,538,457 B2
(45) Date of Patent: Jan. 27, 2026

(54) HEAT DISSIPATION MODULE AND ELECTRONIC DEVICE

(71) Applicant: Sercomm Corporation, Taipei (TW)

(72) Inventors: ChengPu Wu, Taipei (TW); Sheng-Yao Chen, Taipei (TW); Yi Fei Yu, Taipei (TW)

(73) Assignee: Sercomm Corporation, Taipei (TW)

(*) Notice: Subject to any disclaimer, the term of this patent is extended or adjusted under 35 U.S.C. 154(b) by 280 days.

(21) Appl. No.: 18/395,621

(22) Filed: Dec. 25, 2023

(65) Prior Publication Data

US 2024/0215200 A1   Jun. 27, 2024

(30) Foreign Application Priority Data

Dec. 23, 2022 (CN) .......................... 202211661138.7

(51) Int. Cl.
*H05K 7/20* (2006.01)
*H01L 23/367* (2006.01)
*H01L 23/40* (2006.01)

(52) U.S. Cl.
CPC ..... *H05K 7/20409* (2013.01); *H01L 23/3675* (2013.01); *H01L 23/4006* (2013.01); *H05K 7/20436* (2013.01); *H01L 2023/4087* (2013.01)

(58) Field of Classification Search
CPC ......... H01L 23/3675; H01L 2023/4056; H01L 21/4882; H01L 23/3672; H01L 23/4093;
(Continued)

(56) References Cited

U.S. PATENT DOCUMENTS 7,254,034 B2 * 8/2007 Bolle ................. H05K 7/20436
165/185
2003/0183379 A1 * 10/2003 Krassowski ............ F28F 3/048
165/905
(Continued)

FOREIGN PATENT DOCUMENTS

KR   101638027 B1 *  7/2016  .............. F21V 27/02
KR   20190089274 A  *  7/2019  ......... H05K 7/20418

OTHER PUBLICATIONS

English translation KR101638027 (Year: 2015).*
English translation KR20190089274 (Year: 2018).*

*Primary Examiner* — Mandeep S Buttar
(74) *Attorney, Agent, or Firm* — JCIPRNET

(57) ABSTRACT

The invention provides a heat dissipation module and an electronic device. The heat dissipation module includes a thermally conductive plastic member and a metal member. The thermally conductive plastic member includes a base and a plurality of heat dissipation fins. The base includes an upper surface and a lower surface opposite to each other, and the heat dissipation fins are arranged at intervals at the upper surface. The metal member is disposed at the lower surface of the base. The thermally conductive plastic member and the metal member are combined via insert molding. One of the thermally conductive plastic member and the metal member includes a plurality of heat dissipation bosses separated from each other, and the heat dissipation bosses are located at the lower surface of the base of the thermally conductive plastic member or at a surface of the metal member relatively far away from the base.

11 Claims, 8 Drawing Sheets

(58) Field of Classification Search
CPC .............. H01L 23/552; H05K 7/20445; H05K 7/20854; H05K 1/0203; H05K 9/0032; H05K 1/0204; H05K 2201/066; H05K 7/20154; H05K 9/0024; G06F 1/20; G06F 1/1656; F28F 2013/006
USPC ........................................................ 361/704
See application file for complete search history.

(56) References Cited

U.S. PATENT DOCUMENTS

2012/0307501 A1* 12/2012 Tankala .................... F21K 9/90
361/720
2014/0240989 A1* 8/2014 Hardikar ............... F21V 29/773
165/185
2016/0284624 A1* 9/2016 Yamada .............. H01L 23/4338
2017/0181264 A1* 6/2017 Brey .................... H05K 9/0032

* cited by examiner

HEAT DISSIPATION MODULE AND ELECTRONIC DEVICE

CROSS-REFERENCE TO RELATED APPLICATION

This application claims the priority benefit of China application serial no. 202211661138.7, filed on Dec. 23, 2022. The entirety of the above-mentioned patent application is hereby incorporated by reference herein and made a part of this specification.

BACKGROUND OF THE INVENTION

Field of the Invention

The invention relates to a heat dissipation module and an electronic device, and in particular to a heat dissipation module that may simultaneously provide heat dissipation and electromagnetic interference (EMI) shielding functions and an electronic device adopting the heat dissipation module.

Description of Related Art

The heat dissipation modules currently used in Netcom products are formed by independent radiators and metal shields that are assembled together via white adhesive or screw locking, etc. Since the heat sink and the metal shield are two different components, during the assembly process, a thermal interface material needs to be attached between the two components to reduce the thermal resistance between the two. Therefore, in addition to the time-consuming assembly process, the manufacturing method of the heat dissipation module is also prone to issues such as poor product yield or reliability.

SUMMARY OF THE INVENTION

The invention is directed to a heat dissipation module that may simultaneously provide heat dissipation and electromagnetic interference shielding functions and has better structural reliability.

The invention is also directed to an electronic device including the heat dissipation module, and may have better heat dissipation and electromagnetic interference shielding effects, and has better product yield.

According to an embodiment of the invention, the heat dissipation module includes a thermally conductive plastic member and a metal member. The thermally conductive plastic member includes a base and a plurality of heat dissipation fins. The base includes an upper surface and a lower surface opposite to each other, and the heat dissipation fins are arranged at intervals at the upper surface. The metal member is disposed at the lower surface of the base. The thermally conductive plastic member and the metal member are combined via insert molding. One of the thermally conductive plastic member and the metal member includes a plurality of heat dissipation bosses separated from each other, and the heat dissipation bosses are located at the lower surface of the base of the thermally conductive plastic member or at a surface of the metal member relatively far away from the base.

In the heat dissipation module according to an embodiment of the invention, an orthographic projection area of the thermally conductive plastic member on the metal member is less than an area of the metal member.

In the heat dissipation module according to an embodiment of the invention, the thermally conductive plastic member includes the heat dissipation bosses, and a portion of the metal member is located between the heat dissipation bosses and the base.

In the heat dissipation module according to an embodiment of the invention, an orthographic projection area of the thermally conductive plastic member on the metal member is greater than an area of the metal member.

In the heat dissipation module according to an embodiment of the invention, the metal member includes the heat dissipation bosses, and the heat dissipation bosses are protruded by a height relative to a surface of the metal member.

In the heat dissipation module according to an embodiment of the invention, the thermally conductive plastic member also includes a plurality of fixing members separated from each other, and the plurality of fixing members are extended from the lower surface of the base through the metal member and embedded in the surface.

According to an embodiment of the invention, an electronic device includes a circuit board, a chip, and a heat dissipation module. The chip is disposed on the circuit board and electrically connected to the circuit board. The heat dissipation module is detachably disposed on the circuit board and defines an accommodating space with the circuit board, and the chip is located in the accommodating space. The heat dissipation module includes a thermally conductive plastic member and a metal member. The thermally conductive plastic member includes a base and a plurality of heat dissipation fins. The base includes an upper surface and a lower surface opposite to each other, and the heat dissipation fins are arranged at intervals at the upper surface. The metal member is disposed at the lower surface of the base. The thermally conductive plastic member and the metal member are combined via insert molding. One of the thermally conductive plastic member and the metal member includes a plurality of heat dissipation bosses separated from each other, and the heat dissipation bosses are located at the lower surface of the base of the thermally conductive plastic member or at a surface of the metal member relatively far away from the base and correspond to the chip.

In the electronic device according to an embodiment of the invention, an orthographic projection area of the thermally conductive plastic member on the metal member is less than an area of the metal member.

In the electronic device according to an embodiment of the invention, the thermally conductive plastic member includes the heat dissipation bosses, and a portion of the metal member is located between the heat dissipation bosses and the base.

In the electronic device according to an embodiment of the invention, the electronic device further includes a bracket disposed on the circuit board and surrounding the chip. The metal member includes a plurality of first buckling members, and the bracket includes a plurality of second buckling members. The first buckling members buckle the second buckling members respectively, so that the heat dissipation module is fixed on the circuit board.

In the electronic device according to an embodiment of the invention, an orthographic projection area of the thermally conductive plastic member on the metal member is greater than an area of the metal member.

In the electronic device according to an embodiment of the invention, the metal member includes the heat dissipation bosses, and the heat dissipation bosses are protruded by a height relative to a surface of the metal member.

In the electronic device according to an embodiment of the invention, the electronic device further includes a bracket and a plurality of fasteners. The bracket is disposed on the circuit board and surrounds the chip. The thermally conductive plastic member includes a plurality of first fixing members, and the bracket includes a plurality of second fixing members. The fasteners pass through the first fixing member and the second fixing member respectively and sequentially, so that the heat dissipation module is fixed on the circuit board.

In the electronic device according to an embodiment of the invention, the thermally conductive plastic member further includes a conductive adhesive disposed at the lower surface of the base and surrounding a periphery of the base.

In the electronic device according to an embodiment of the invention, the thermally conductive plastic member also includes a plurality of fixing members separated from each other. The fixing members are extended from the lower surface of the base through the metal member and is embedded in the surface.

Based on the above, in the design of the heat dissipation module of the invention, the thermally conductive plastic member and the metal member are combined via insert molding, and one of the thermally conductive plastic member and the metal member includes the heat dissipation bosses, wherein both the thermally conductive plastic member and the metal member themselves have the characteristics of heat dissipation and electromagnetic interference shielding. Therefore, the heat dissipation module of the invention may simultaneously provide heat dissipation and electromagnetic interference shielding functions, and has better structural reliability. In addition, an electronic device adopting the heat dissipation module of the invention may have better heat dissipation and electromagnetic interference shielding effects.

DESCRIPTION OF THE EMBODIMENTS

Figure 1A:
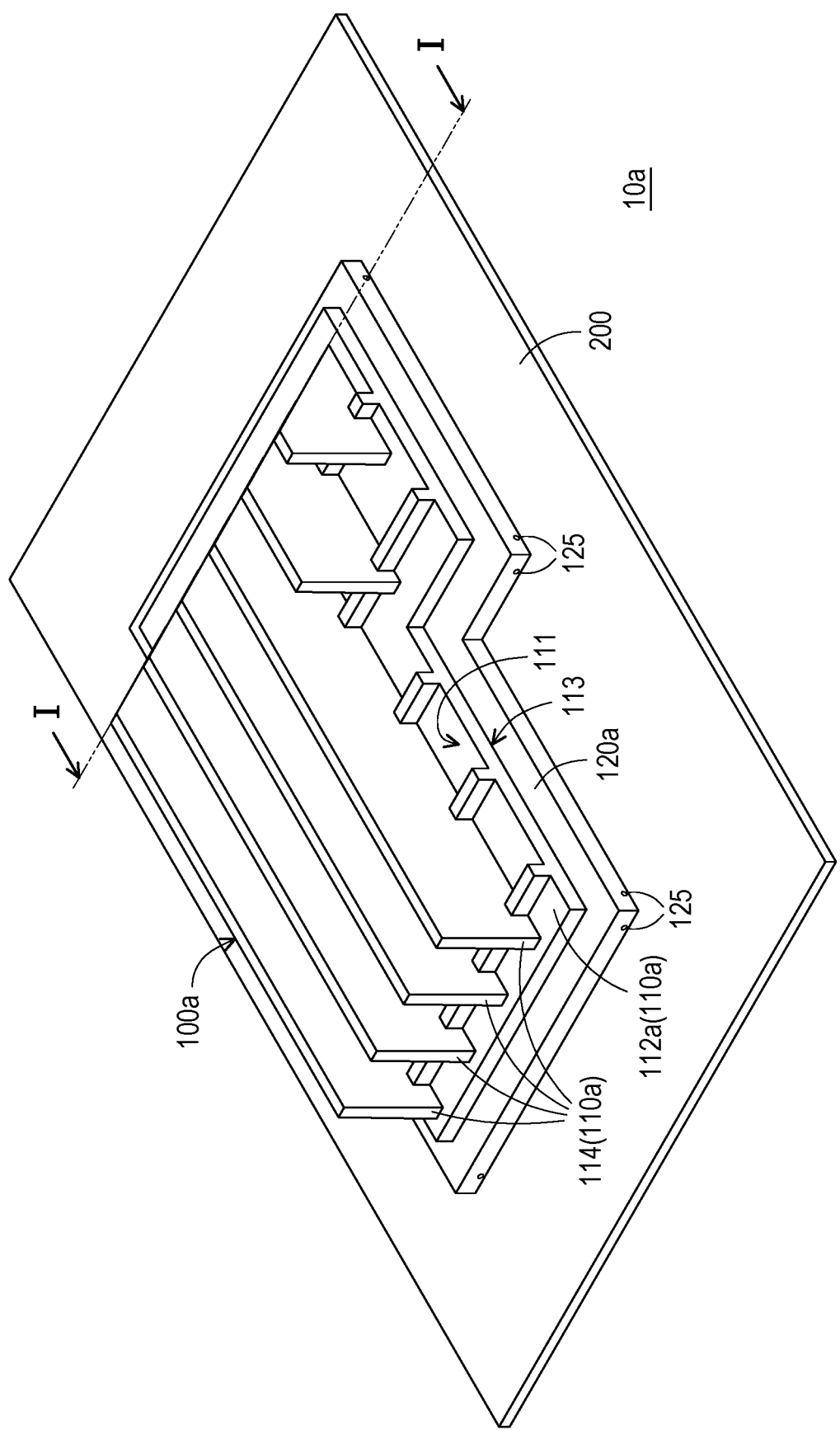
FIG. 1A is a schematic three-dimensional view of an electronic device of an embodiment of the invention.

Reference will now be made in detail to exemplary embodiments of the invention, which are illustrated in the accompanying drawings. The same reference numerals are used in the figures and the descriptions to refer to the same or similar portions.

Figure 1B:
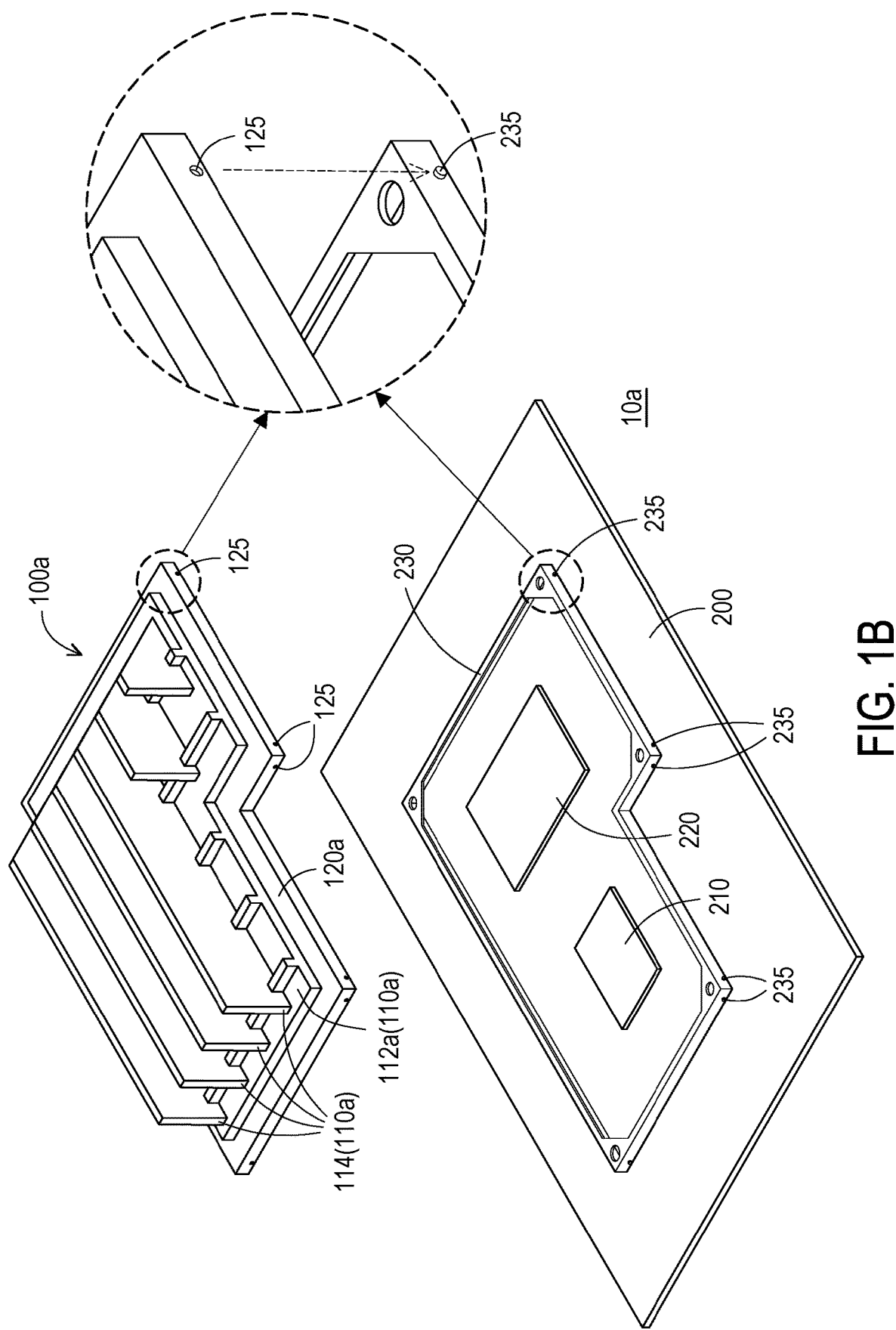
FIG. 1B is a partially exploded schematic three-dimensional view of the electronic device of FIG. 1A.
Figure 1C:
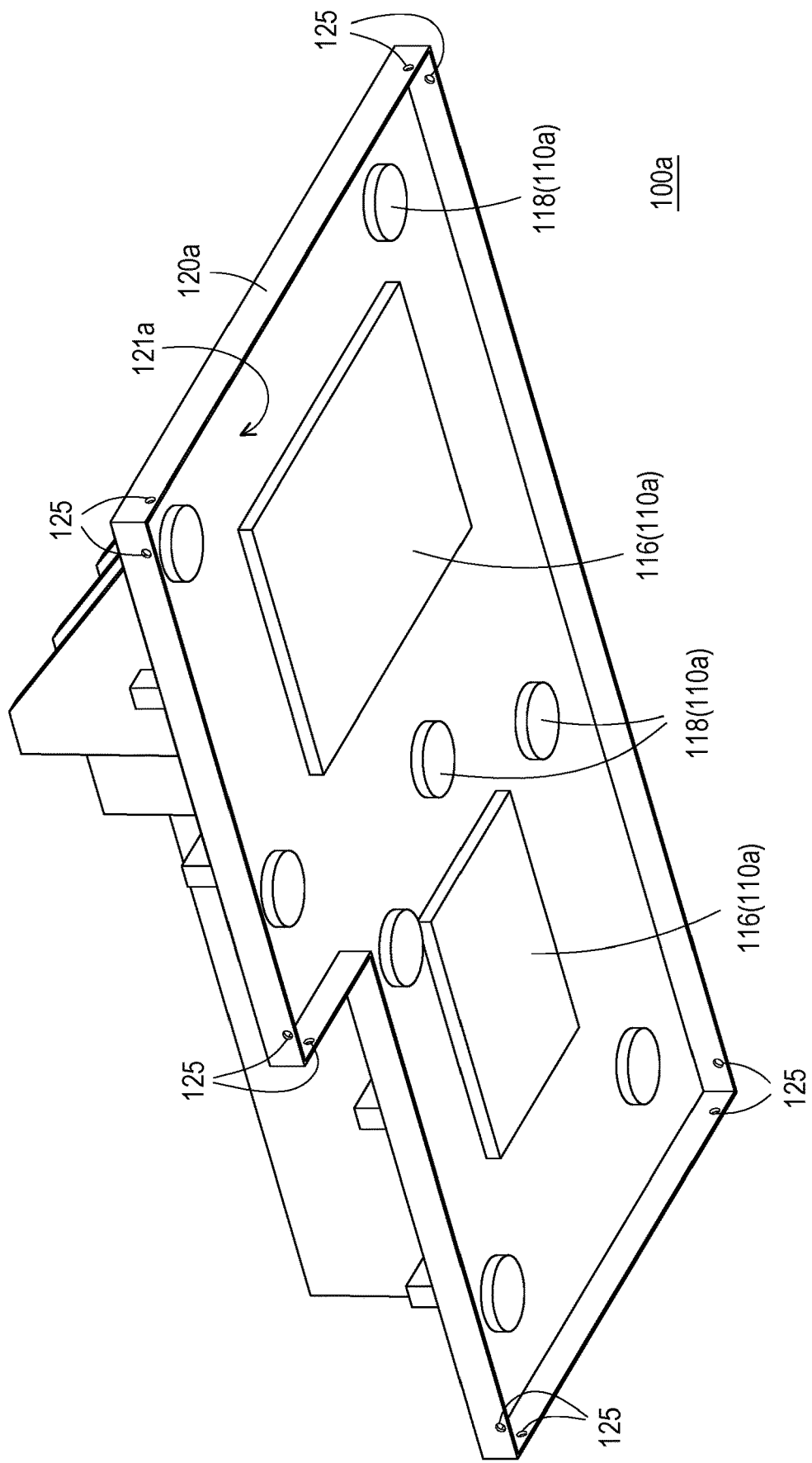
FIG. 1C is a schematic three-dimensional bottom view of the heat dissipation module of the electronic device of FIG. 1A.
Figure 1D:
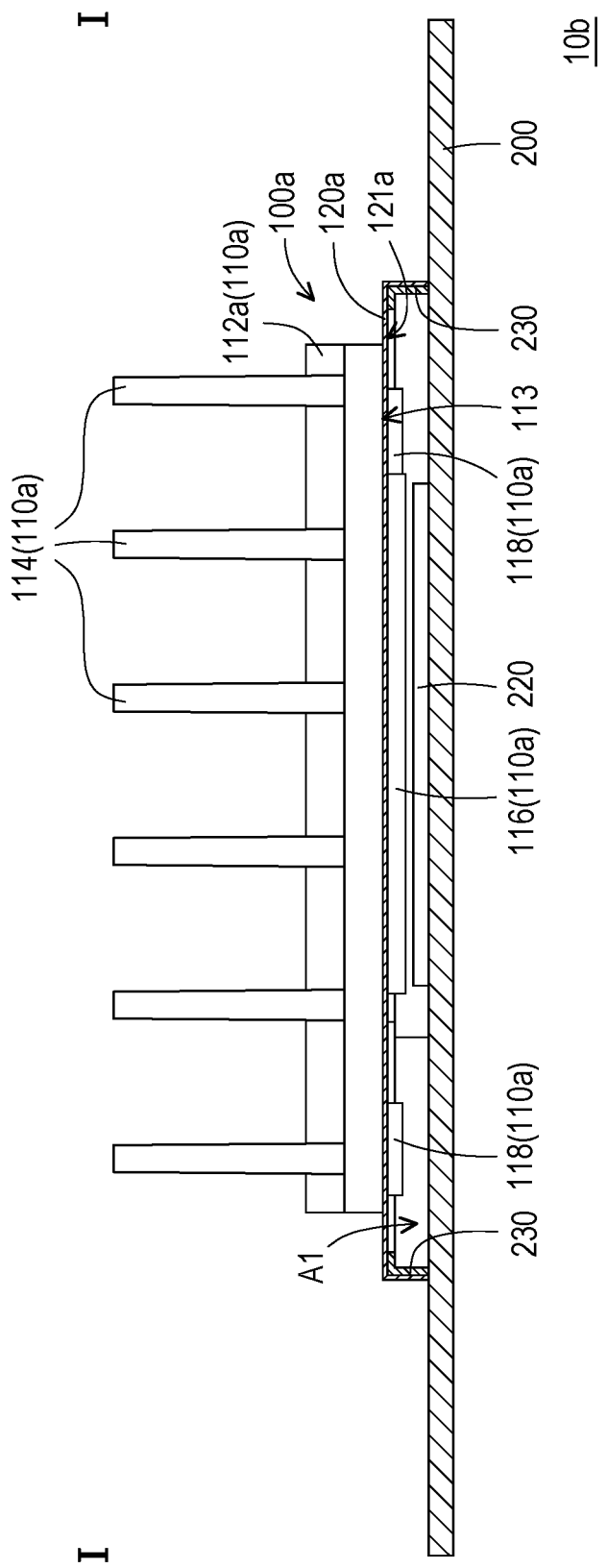
FIG. 1D is a schematic cross-sectional view along line I-I of FIG. 1A.

FIG. 1A is a schematic three-dimensional view of an electronic device of an embodiment of the invention. FIG. 1B is a partially exploded schematic three-dimensional view of the electronic device of FIG. 1A. FIG. 1C is a schematic three-dimensional bottom view of the heat dissipation module of the electronic device of FIG. 1A. FIG. 1D is a schematic cross-sectional view along line I-I of FIG. 1A.

Please refer to FIG. 1A, FIG. 1B, and FIG. 1D simultaneously. In the present embodiment, an electronic device 10a includes a circuit board 200, chips 210 and 220, and a heat dissipation module 100a. The chips 210 and 220 are disposed on the circuit board 200 and electrically connected to the circuit board 200. In an embodiment, the chips 210 and 220 are high-power chips such as central processing units or communication chips. The heat dissipation module 100a is detachably disposed on the circuit board 200 and defines an accommodating space A1 with the circuit board 200, and the chips 210 and 220 are located in the accommodating space A1.

Specifically, please refer to FIG. 1A, FIG. 1B, and FIG. 1C. In the present embodiment, the heat dissipation module 100a includes a thermally conductive plastic member 110a and a metal member 120a. The thermally conductive plastic member 110a includes a base 112a and a plurality of heat dissipation fins 114. The base 112a includes an upper surface 111 and a lower surface 113 opposite to each other, and the heat dissipation fins 114 are arranged at intervals at the upper surface 111 of the base 112a. Here, the base 112a is flat, and the base 112a and the heat dissipation fins 114 are seamlessly connected and integrally formed. The metal member 120a is disposed at the lower surface 113 of the base 112a. In the present embodiment, the thermally conductive plastic member 110a and the metal member 120a are implemented by combining via insert molding, so that the thermally conductive plastic member 110a and the metal member 120a are seamlessly connected without using the thermal interface material in the prior art. One of the thermally conductive plastic member 110a and the metal member 120a includes a plurality of heat dissipation bosses separated from each other. In the present embodiment, the thermally conductive plastic member 110a includes heat dissipation bosses 116, and the heat dissipation bosses 116 are located at the surface 121a of the metal member 120a relatively far away from the base 112a.

Please refer to FIG. 1C and FIG. 1D at the same time. The thermally conductive plastic member 110a of the present embodiment also includes a plurality of fixing members 118 separated from each other, wherein the fixing members 118 are extended from the lower surface 113 of the base 112a through the metal member 120a and embedded in the surface 121a to provide better bonding ability between the thermally conductive plastic member 110a and the metal member 120a. A portion of the metal member 120a may be clamped between the heat dissipation bosses 116 and the base 112a, thereby increasing the bonding ability between the thermally conductive plastic member 110a and the metal member 120a. Please refer to FIG. 1A and FIG. 1D at the same time. The orthographic projection area of the thermally conductive plastic member 110a on the metal member 120a is less than the area of the metal member 120a. That is, the metal member 120a is protruded to a certain range relative to the thermally conductive plastic member 110a, and together forms a shielding structure to cover the chips 210 and 220. In the present embodiment, the metal member 120a is made of tinplate. In other embodiments, aluminum alloy or other suitable materials may also be used.

Since the thermally conductive plastic member 110a and the metal member 120a of the present embodiment form the integrally formed heat dissipation module 100a via insert molding, during the manufacturing process, the thermally conductive plastic member 110a is formed on the metal member 120a via hot die-casting to ensure that there is no contact thermal resistance such as air layer during the molding process. Therefore, there is no need to attach additional thermal interface materials to achieve better heat transfer performance and cost efficiency. Furthermore, the material properties of the thermally conductive plastic member 110a and the metal member 120a themselves both simultaneously have the function of dissipating heat and shielding electromagnetic interference, and the thermally conductive plastic member 110a also has high thermal radiation efficiency. Therefore, in addition to simultaneously having the functions of heat dissipation and electromagnetic interference shielding, the heat dissipation module 100a of the present embodiment may also effectively reduce assembly processes and production costs, thereby achieving better structural reliability.

Please refer to FIG. 1A and FIG. 1B at the same time. The electronic device 10a of the present embodiment further includes a bracket 230 disposed on the circuit board 200 and surrounding the chips 210 and 220. In order to optimize the assembly process, the metal member 120a of the present embodiment includes a plurality of first buckling members 125 located at the surrounding sidewalls, and the bracket 230 includes a plurality of second buckling members 235 located at the surrounding sidewalls. The first buckling members 125 may be buckled with the corresponding second buckling members 235 respectively, so that the heat dissipation module 100a may be detachably fixed on the circuit board 200. At this time, as shown in FIG. 1D, the periphery of the metal member 120a covers the periphery of the bracket 230, so that the heat dissipation module 100a and the circuit board 200 define the accommodating space A1. The heat dissipation bosses 116 may be in contact with the corresponding chips 210 and 220 respectively, so that the heat generated by the high-power chips 210 and 220 may be directly transferred to the thermally conductive plastic member 110a to optimize the heat dissipation path of the chips 210 and 220. In an embodiment, one of the first buckling members 125 and the second buckling members 235 are buckling holes, and the other of the first buckling members 125 and the second buckling members 235 are buckling blocks. Here, the first buckling members 125 are implemented in the form of buckling holes, and the second buckling members 235 are implemented in the form of buckling blocks.

In other embodiments, in order to more effectively fix the heat dissipation module on the bracket, the first buckling members 125 and the second buckling members 235 may also adopt an appropriate combining method such as locking via screws/bolts to lock the metal member of the heat dissipation module and the bracket together, which is still within the scope of the invention.

In short, since the thermally conductive plastic member 110a and the metal member 120a of the present embodiment are integrally formed via insert molding, and the thermally conductive plastic member 110a includes the heat dissipation bosses 116 disposed corresponding to the chips 210 and 220, wherein both the thermally conductive plastic member 110a and the metal member 120a themselves have the characteristics of heat dissipation and electromagnetic interference shielding, the heat dissipation module 100a of the present embodiment may simultaneously provide heat dissipation and electromagnetic interference shielding functions, and has better structural reliability. In addition, the electronic device 10a adopting the heat dissipation module 100a of the present embodiment may have better heat dissipation and electromagnetic interference shielding effects, and has better product yield.

In addition, the implementation methods such as the shape and proportion of the thermally conductive plastic member and metal member may also be appropriately adjusted based on different considerations. The following embodiments adopt the reference numerals and part of the content of the above embodiments, wherein the same reference numerals are used to represent the same or similar elements, and the description of the same technical content is omitted. For the description of the omitted parts, reference may be made to the above embodiments, which is not repeated in the following embodiments.

Figure 2A:
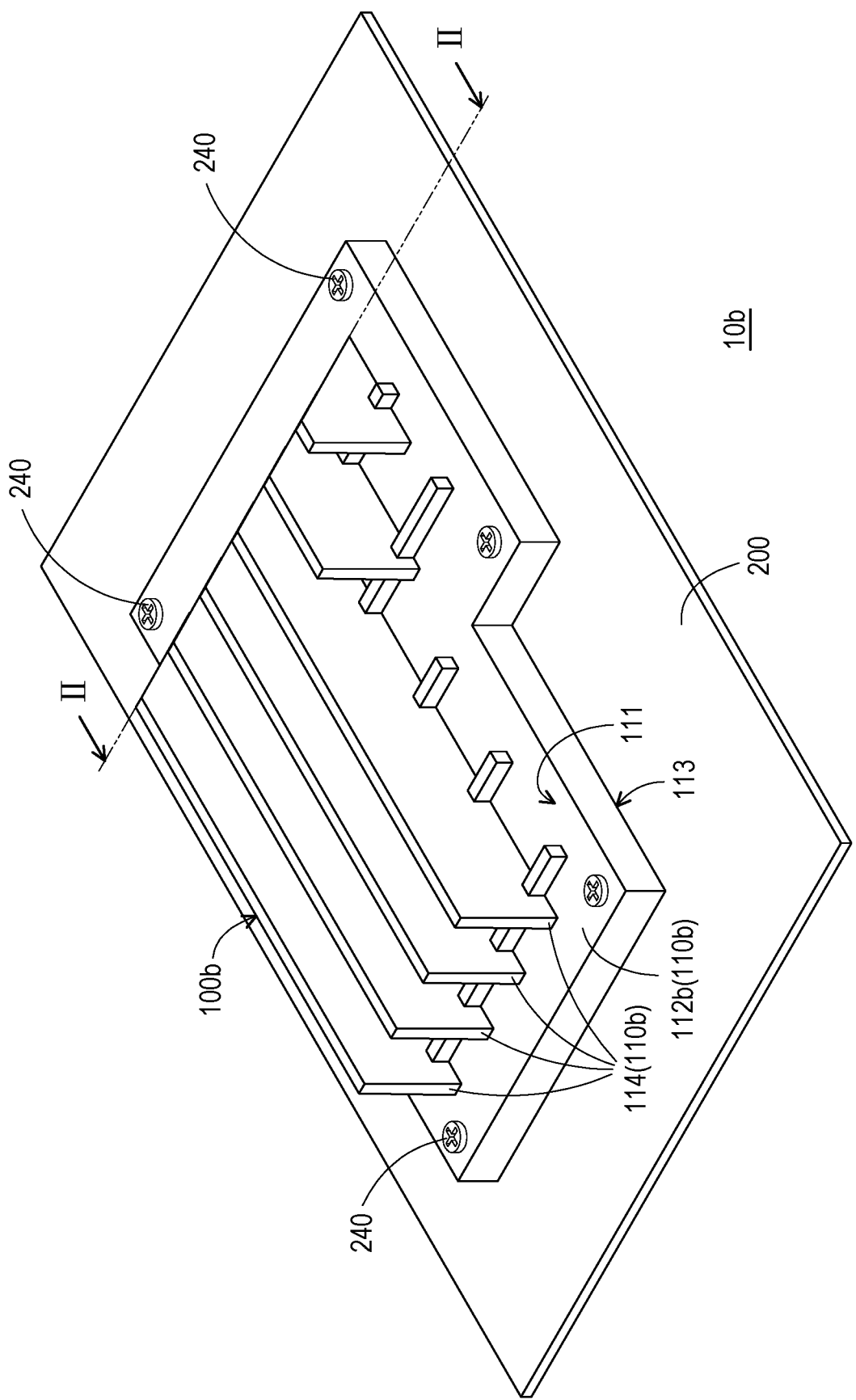
FIG. 2A is a schematic three-dimensional view of an electronic device of another embodiment of the invention.
Figure 2B:
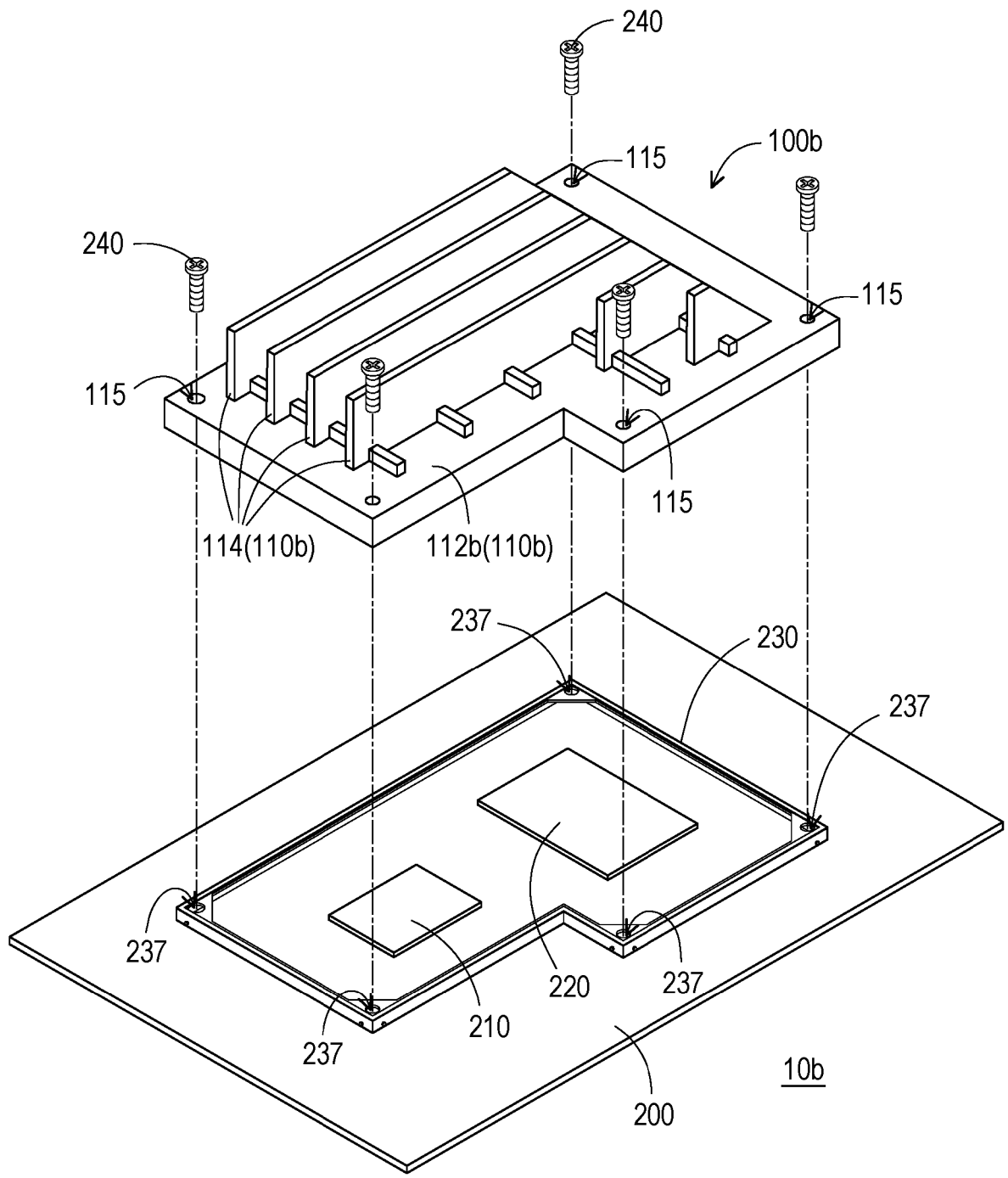
FIG. 2B is a partially exploded schematic three-dimensional view of the electronic device of FIG. 2A.
Figure 2C:
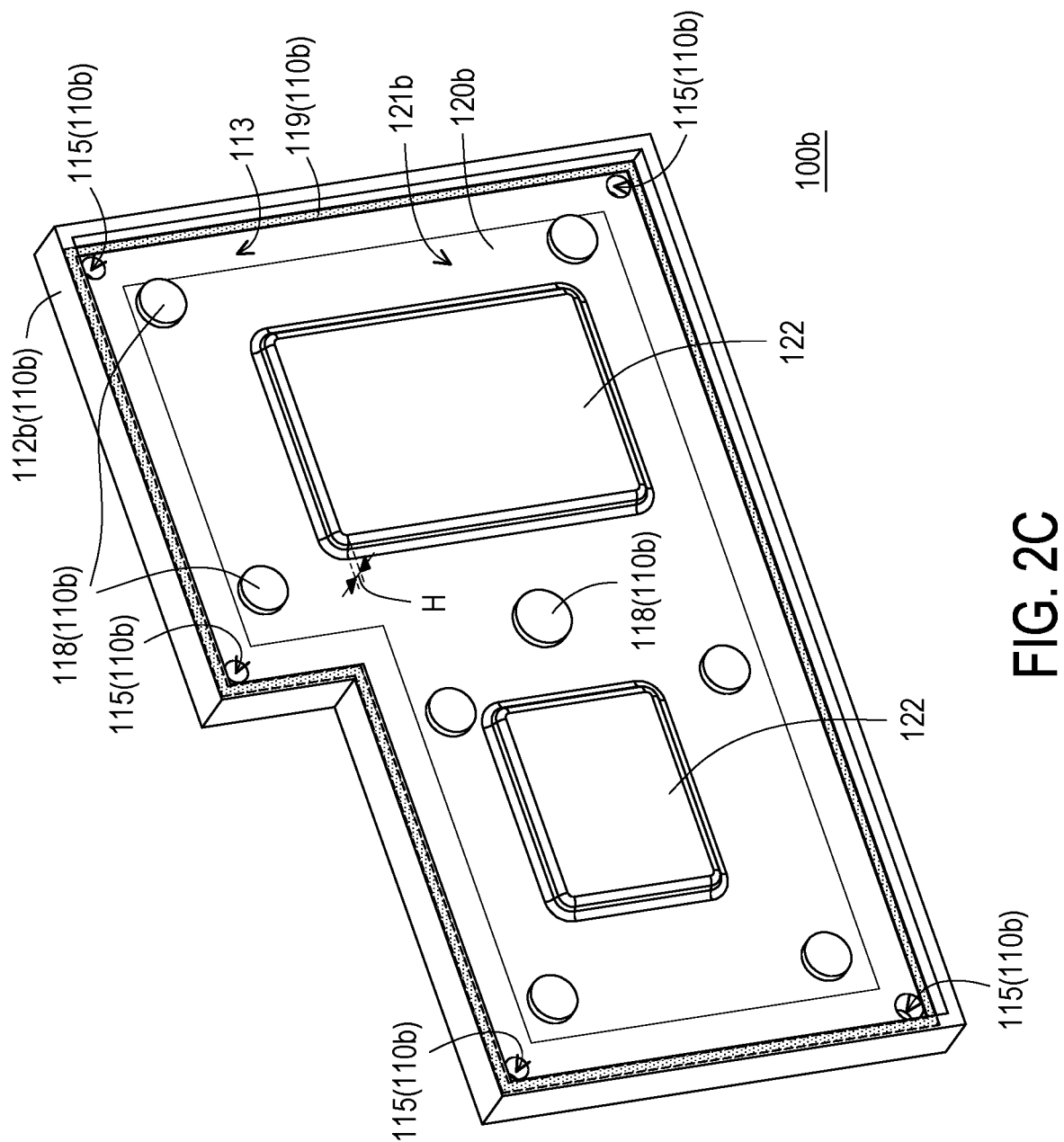
FIG. 2C is a schematic three-dimensional bottom view of the heat dissipation module of the electronic device of FIG. 2A.
Figure 2D:
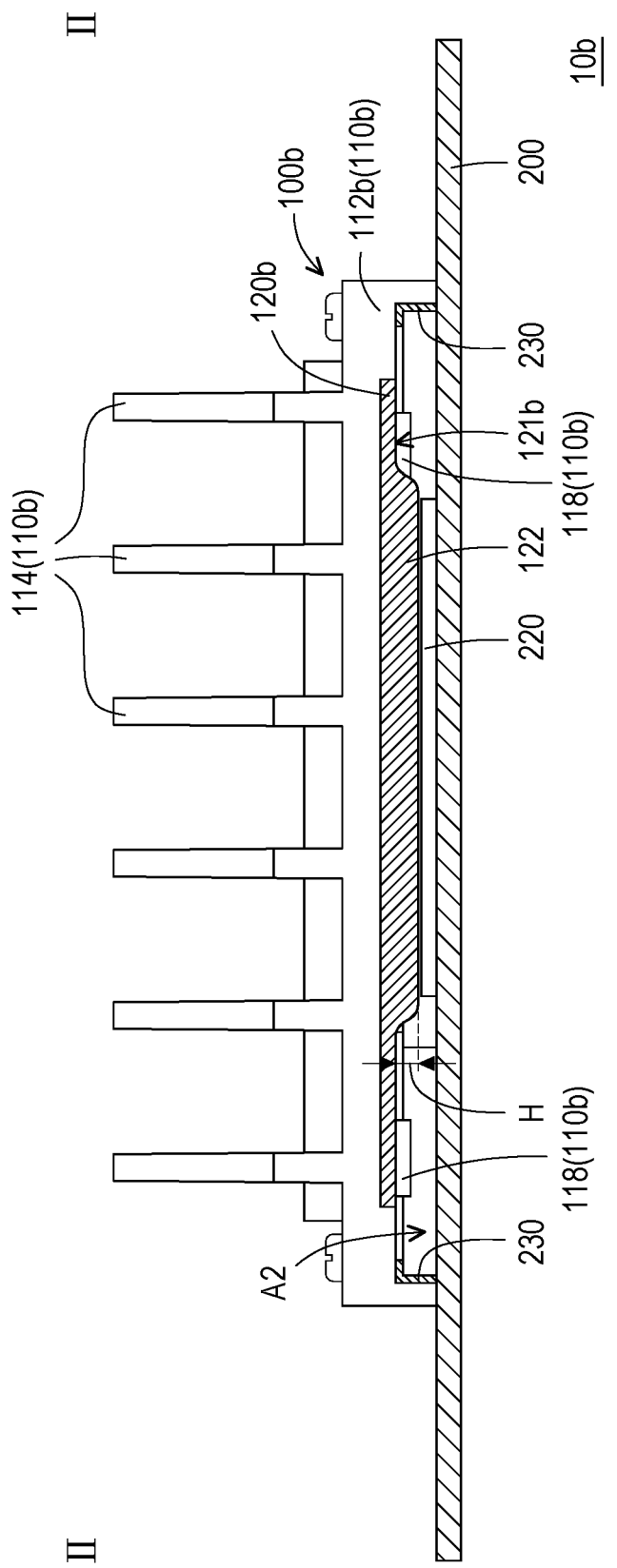
FIG. 2D is a schematic cross-sectional view along line II-II of FIG. 2A.

FIG. 2A is a schematic three-dimensional view of an electronic device of another embodiment of the invention. FIG. 2B is a partially exploded schematic three-dimensional view of the electronic device of FIG. 2A. FIG. 2C is a schematic three-dimensional bottom view of the heat dissipation module of the electronic device of FIG. 2A. FIG. 2D is a schematic cross-sectional view along line II-II of FIG. 2A.

Please refer to FIG. 1A, FIG. 2A, and FIG. 2B simultaneously. An electronic device 10b of the present embodiment is similar to the electronic device 10a of FIG. 1A. The base 112a of the thermally conductive plastic member 110a of FIG. 1A is flat, and a base 112b of a thermally conductive plastic member 110b of a heat dissipation module 100b of the present embodiment is a shielding structure, and a metal member 120b is disposed at the lower surface 113 of the base 112b, wherein the thermally conductive plastic member 110b and the metal member 120b are combined via insert molding, and the material of the metal member 120b is aluminum alloy. In other embodiments, the metal member 120b may also be implemented by other suitable materials.

Specifically, please refer to FIG. 2A, FIG. 2B, and FIG. 2D at the same time. In the present embodiment, the orthographic projection area of the thermally conductive plastic member 110b on the metal member 120b is greater than the area of the metal member 120b. Therefore, when the heat dissipation module 100b is disposed on the circuit board 200, the periphery of the thermally conductive plastic member 110b covers the periphery of the bracket 230, so that the heat dissipation module 100b and the circuit board 200 define an accommodating space A2, and the chips 210 and 220 are located in the accommodating space A2. In order to optimize the assembly process, the electronic device 10b of the present embodiment further includes a fastener 240, and the thermally conductive plastic member 110b includes a plurality of first fixing members 115, and the bracket 230 includes a plurality of second fixing members 237. The fastener 240 may pass through the first fixing members 115 and the second fixing members 237 respectively and sequentially, so that the heat dissipation module 100b is fixed on the circuit board 200. Here, the fastener 240 is a screw or a bolt, and the first fixing members 115 and the second fixing members 237 may be lock holes respectively. In other embodiments, appropriate locking members may also be adopted respectively.

In other embodiments, in order to improve the accuracy of assembly, buckling portions may also be disposed at the peripheral sidewalls of the thermally conductive plastic member and the peripheral sidewalls of the bracket. The assembly accuracy between the heat dissipation module and the bracket is improved by buckling the buckling portions with each other, which is still within the scope of the invention.

Please refer to FIG. 2B, FIG. 2C, and FIG. 2D at the same time. The thermally conductive plastic member 110b of the present embodiment also includes a conductive adhesive 119 disposed at the lower surface 113 of the base 110b and surrounding the periphery of the base 112b to ensure shielding and grounding properties between the thermally conductive plastic member 110b and the bracket 230 on the circuit board 200 after being combined. Moreover, the metal member 120b of the present embodiment includes heat dissipation bosses 122, wherein the heat dissipation bosses 122 may be located at the lower surface 113 of the base 112b of the thermally conductive plastic member 110b, and the heat dissipation bosses 122 are protruded by a height H relative to a surface 121b of the metal member 120b. The heat dissipation bosses 122 may respectively be in contact with the corresponding chips 210 and 220 to increase the temperature uniformity and heat conduction efficiency of the heat dissipation module 100b.

Since the thermally conductive plastic member 110b and the metal member 120b of the present embodiment form the integrally formed heat dissipation module 100b via insert molding, during the manufacturing process, the thermally conductive plastic member 110b is formed on the metal member 120b via hot die-casting to ensure that there is no contact thermal resistance such as air layer during the molding process. Therefore, there is no need to attach additional thermal interface materials to achieve better heat transfer performance and cost efficiency. Therefore, in addition to simultaneously having the functions of heat dissipation and electromagnetic interference shielding, the heat dissipation module 100b of the present embodiment may also effectively reduce assembly processes and production costs, thereby achieving better structural reliability. In addition, the electronic device 10b adopting the heat dissipation module 100b of the present embodiment may have better heat dissipation and electromagnetic interference shielding effects, and may have better product yield.

Based on the above, in the design of the heat dissipation module of the invention, the thermally conductive plastic member and the metal member are combined via insert molding, and one of the thermally conductive plastic member and the metal member includes the heat dissipation bosses, wherein both the thermally conductive plastic member and the metal member themselves have the characteristics of heat dissipation and electromagnetic interference shielding. Therefore, the heat dissipation module of the invention may simultaneously provide heat dissipation and electromagnetic interference shielding functions, and has better structural reliability. In addition, an electronic device adopting the heat dissipation module of the invention may have better heat dissipation and electromagnetic interference shielding effects.

Thermally conductive plastics are not only easy to shape and may reduce manufacturing difficulty and improve product yield, but also may achieve the desired electromagnetic interference shielding effect by doping appropriate materials in the thermally conductive plastics. For example, when electronic devices readily generate an electromagnetic signal of a specific frequency or are readily interfered by an electromagnetic signal of a specific frequency, at this time, the doping materials of the thermally conductive plastics may be adjusted to improve the electromagnetic shielding effect of this special frequency. In addition, thermally conductive plastics are lighter in weight, so electronic devices may be made lighter and suitable for more application scenarios. For example, the invention may be applied to applications such as new-generation WiFi wireless access points, pocket-sized WiFi relay devices, and mobile access home gateways.

The above embodiments are only used to describe the technical solutions of the invention instead of limiting them. Although the invention is described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the invention.

What is claimed is:

1. A heat dissipation module, comprising: a thermally conductive plastic member comprising a base and a plurality of heat dissipation fins, the base comprises an upper surface and a lower surface opposite to each other, and the plurality of heat dissipation fins are arranged at intervals at the upper surface; and a metal member disposed at the lower surface of the base, wherein the thermally conductive plastic member and the metal member are combined via insert molding, one of the thermally conductive plastic member and the metal member comprises a plurality of heat dissipation bosses separated from each other, and the plurality of heat dissipation bosses are located at the lower surface of the base of the thermally conductive plastic member or at a surface of the metal member relatively far away from the base; wherein an orthographic projection area of the thermally conductive plastic member on the metal member is less than an area of the metal member.

2. The heat dissipation module of claim 1, wherein the thermally conductive plastic member comprises the plurality of heat dissipation bosses, and a portion of the metal member is located between the plurality of heat dissipation bosses and the base.

3. The heat dissipation module of claim 1, wherein the metal member comprises the plurality of heat dissipation bosses, and the plurality of heat dissipation bosses are protruded by a height relative to the surface of the metal member.

4. The heat dissipation module of claim 1, wherein the thermally conductive plastic member also comprises a plurality of fixing members separated from each other, and the plurality of fixing members are extended from the lower surface of the base through the metal member and embedded in the surface.

5. An electronic device, comprising: a circuit board; a chip disposed on the circuit board and electrically connected to the circuit board; and a heat dissipation module detachably disposed on the circuit board and defining an accommodating space with the circuit board, the chip is located in the accommodating space, and the heat dissipation module comprises: a thermally conductive plastic member comprising a base and a plurality of heat dissipation fins, the base comprises an upper surface and a lower surface opposite to each other, and the plurality of heat dissipation fins are arranged at intervals at the upper surface; and a metal member disposed at the lower surface of the base, wherein the thermally conductive plastic member and the metal member are combined via insert molding, one of the thermally conductive plastic member and the metal member comprises a plurality of heat dissipation bosses separated from each other, and the plurality of heat dissipation bosses are located at the lower surface of the base of the thermally conductive plastic member or at a surface of the metal member relatively far away from the base and correspond to the chip; wherein an orthographic projection area of the thermally conductive plastic member on the metal member is less than an area of the metal member.

6. The electronic device of claim 5, wherein the thermally conductive plastic member comprises the plurality of heat dissipation bosses, and a portion of the metal member is located between the plurality of heat dissipation bosses and the base.

7. The electronic device of claim 5, further comprising: a bracket disposed on the circuit board and surrounding the chip, wherein the metal member comprises a plurality of first buckling members, and the bracket comprises a plurality of second buckling members, and the plurality of first buckling members respectively buckle the plurality of second buckling members, so that the heat dissipation module is fixed on the circuit board.

8. The electronic device of claim 5, wherein the metal member comprises the plurality of heat dissipation bosses, and the plurality of heat dissipation bosses are protruded by a height relative to the surface of the metal member.

9. The electronic device of claim 5, further comprising: a bracket disposed on the circuit board and surrounding the chip, wherein the thermally conductive plastic member comprises a plurality of first fixing members, and the bracket comprises a plurality of second fixing members; and a plurality of fasteners passing through the plurality of first fixing members and the plurality of second fixing members respectively and sequentially, so that the heat dissipation module is fixed on the circuit board.

10. The electronic device of claim 5, wherein the thermally conductive plastic member also comprises a conductive adhesive disposed at the lower surface of the base and surrounding a periphery of the base.

11. The electronic device of claim 5, wherein the thermally conductive plastic member also comprises a plurality of fixing members separated from each other, and the plurality of fixing members are extended from the lower surface of the base through the metal member and embedded in the surface.

\* \* \* \* \*